(12) United States Patent
Han et al.

(10) Patent No.: US 10,418,548 B2
(45) Date of Patent: Sep. 17, 2019

(54) MAGNETIC MEMORY DEVICE

(71) Applicant: SAMSUNG ELECTRONICS CO., LTD., Suwon-si, Gyeonggi-do (KR)

(72) Inventors: Shinhee Han, Seongnam-si (KR); Kiseok Suh, Hwaseong-si (KR); KyungTae Nam, Suwon-si (KR); Woojin Kim, Guri-si (KR); Kwangil Shin, Seoul (KR); Minkyoung Joo, Seoul (KR); Gwanhyeob Koh, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/018,700

(22) Filed: Jun. 26, 2018

(65) Prior Publication Data

US 2018/0309052 A1   Oct. 25, 2018

Related U.S. Application Data

(62) Division of application No. 15/244,344, filed on Aug. 23, 2016, now Pat. No. 10,032,981.

(30) Foreign Application Priority Data

Sep. 25, 2015   (KR) .................... 10-2015-0136274

(51) Int. Cl.
  *H01L 43/12*   (2006.01)
  *H01L 43/02*   (2006.01)
  (Continued)

(52) U.S. Cl.
  CPC ............ *H01L 43/12* (2013.01); *G11C 11/161* (2013.01); *G11C 11/1657* (2013.01);
  (Continued)

(58) Field of Classification Search
  CPC ..... H01L 43/12; H01L 27/228; H01L 27/222; H01L 27/10876; H01L 21/76877; H01L 21/76897
  See application file for complete search history.

(56) References Cited

U.S. PATENT DOCUMENTS 6,884,731 B2   4/2005   Hwang et al.
7,953,920 B2   5/2011   Yano et al.
(Continued)

FOREIGN PATENT DOCUMENTS

JP   2008-042033 A   2/2008
JP   2012-234885 A   11/2012
(Continued)

*Primary Examiner* — Zandra V Smith
*Assistant Examiner* — John M Parker
(74) *Attorney, Agent, or Firm* — Lee & Morse, P.C.

(57) ABSTRACT

A method of fabricating a magnetic memory device includes forming an interlayered insulating layer on a substrate, forming a landing pad to pass through the interlayered insulating layer, forming a protection insulating layer on the interlayered insulating layer to cover a top surface of the landing pad, forming a bottom electrode to pass through the protection insulating layer and through the interlayered insulating layer, forming a magnetic tunnel junction layer on the protection insulating layer; and patterning the magnetic tunnel junction layer to form a magnetic tunnel junction pattern on the bottom electrode.

18 Claims, 13 Drawing Sheets

(51) Int. Cl.
  *H01L 43/08* (2006.01)
  *H01L 43/10* (2006.01)
  *H01L 27/22* (2006.01)
  *G11C 11/16* (2006.01)

(52) U.S. Cl.
  CPC ........ *G11C 11/1659* (2013.01); *H01L 27/226* (2013.01); *H01L 27/228* (2013.01); *H01L 43/02* (2013.01); *H01L 43/08* (2013.01); *H01L 43/10* (2013.01); *G11C 11/1673* (2013.01); *G11C 11/1675* (2013.01)

(56) References Cited

U.S. PATENT DOCUMENTS

| | | | |
|---|---|---|---|
| 8,574,928 | B2 | 11/2013 | Satoh et al. |
| 8,710,485 | B2 | 4/2014 | Saitoh et al. |
| 8,748,197 | B2 | 6/2014 | Wang et al. |
| 8,883,520 | B2 | 11/2014 | Satoh et al. |
| 2002/0175357 | A1* | 11/2002 | Kim ................... B82Y 10/00 257/296 |
| 2002/0195630 | A1* | 12/2002 | Sakata ................. B82Y 10/00 257/296 |
| 2010/0001356 | A1 | 1/2010 | Kim |
| 2012/0056253 | A1 | 3/2012 | Iwayama et al. |
| 2015/0014800 | A1 | 1/2015 | Satoh et al. |
| 2015/0014801 | A1 | 1/2015 | Satoh et al. |
| 2015/0171314 | A1 | 6/2015 | Li et al. |
| 2016/0218145 | A1 | 7/2016 | Han et al. |
| 2017/0069684 | A1 | 3/2017 | Suh et al. |
| 2017/0092852 | A1 | 3/2017 | Son et al. |
| 2017/0200487 | A1 | 7/2017 | Kim et al. |
| 2017/0221557 | A1 | 8/2017 | Kim et al. |

FOREIGN PATENT DOCUMENTS

| | | |
|---|---|---|
| KR | 2004-0069061 A | 8/2004 |
| KR | 2009-0106651 A | 10/2009 |
| KR | 10-2016-0090954 A | 8/2016 |

* cited by examiner

MAGNETIC MEMORY DEVICE

CROSS-REFERENCE TO RELATED APPLICATIONS

This is a divisional application based on pending application Ser. No. 15/244,344, filed Aug. 23, 2016, the entire contents of which is hereby incorporated by reference.

Korean Patent Application No. 10-2015-0136274, filed on Sep. 25, 2015, in the Korean Intellectual Property Office, and entitled: "Magnetic Memory Device and Method of Fabricating the Same," is incorporated by reference herein in its entirety.

BACKGROUND

1. Field

The present disclosure relates to a memory device and a method of fabricating the same, and in particular, to a magnetic memory device including a magnetic tunnel junction and a method of fabricating the same.

2. Description of the Related Art

Due to the increased demand for electronic devices with a fast speed and/or a low power consumption, memory devices embedded in the electronic devices require a fast operating speed and/or a low operating voltage. Magnetic memory devices have been suggested to satisfy such requirements. For example, the magnetic memory device can provide technical advantages, e.g., reduced latency and/or non-volatility, and thus, the magnetic memory devices are emerging as next-generation memory devices.

The magnetic memory device may include a plurality of magnetic tunnel junctions (MTJ), each of which includes two magnetic layers and a tunnel barrier layer interposed therebetween. Resistance of the magnetic tunnel junction may vary depending on magnetization directions of the magnetic layers. The resistance of the magnetic tunnel junction is higher when the magnetization directions of the magnetic layers are anti-parallel to each other, as compared to the resistance of the magnetic tunnel junction when the magnetization directions of the magnetic layers are parallel to each other. This difference in resistance can be used as a data storing mechanism for the magnetic memory device. For example, a spin-transfer-torque magnetic random access memory (STT-MRAM) is regarded as a promising high-density memory device, because it is possible to reduce an amount or density of a write current required for a writing operation, even when a magnetic memory cell is scaled down.

SUMMARY

Some embodiments provide a highly reliable magnetic memory device.

Some embodiments provide a method of fabricating a highly reliable magnetic memory device.

According to some embodiments, a method of fabricating a magnetic memory device may include forming an interlayered insulating layer on a substrate, forming a landing pad to pass through the interlayered insulating layer, forming a protection insulating layer on the interlayered insulating layer to cover a top surface of the landing pad, forming a bottom electrode to pass through the protection insulating layer and the interlayered insulating layer, forming a magnetic tunnel junction layer on the protection insulating layer, and patterning the magnetic tunnel junction layer to form a magnetic tunnel junction pattern on the bottom electrode.

In some embodiments, the patterning of the magnetic tunnel junction layer may be performed to partially etch the protection insulating layer.

In some embodiments, a portion of the protection insulating layer may remain on the landing pad after the patterning of the magnetic tunnel junction layer.

In some embodiments, the top surface of the landing pad may be exposed after the patterning of the magnetic tunnel junction layer.

In some embodiments, a top surface of the bottom electrode may be positioned at a level higher than that of the top surface of the landing pad.

In some embodiments, the forming of the landing pad may include forming a first penetration hole to penetrate the interlayered insulating layer, forming a first conductive layer to fill the first penetration hole, and planarizing the first conductive layer to expose a top surface of the interlayered insulating layer.

In some embodiments, the forming of the bottom electrode may include forming a second penetration hole to penetrate the protection insulating layer and the interlayered insulating layer, forming a second conductive layer to fill the second penetration hole, and planarizing the second conductive layer to expose a top surface of the protection insulating layer.

In some embodiments, the method may further include forming a connection contact electrically connected to the landing pad and forming a connection pattern electrically connecting the connection contact to a top surface of the magnetic tunnel junction pattern.

According to some embodiments, a method of fabricating a magnetic memory device may include forming an interlayered insulating layer on a substrate, forming a landing pad to pass through the interlayered insulating layer, forming a protection insulating layer on the interlayered insulating layer to cover a top surface of the landing pad, forming first and second bottom electrodes to pass through the protection insulating layer and the interlayered insulating layer, forming a magnetic tunnel junction layer on the protection insulating layer, and patterning the magnetic tunnel junction layer to form first and second magnetic tunnel junction patterns on the first and second bottom electrodes, respectively. A bottom surface of the first magnetic tunnel junction pattern may be electrically connected to the first bottom electrode, and a bottom surface of the second magnetic tunnel junction pattern may be electrically connected to the second bottom electrode.

In some embodiments, the patterning of the magnetic tunnel junction layer may be performed to partially etch the protection insulating layer.

In some embodiments, a portion of the protection insulating layer may remain on the landing pad after the patterning of the magnetic tunnel junction layer.

In some embodiments, the top surface of the landing pad may be exposed after the patterning of the magnetic tunnel junction layer.

In some embodiments, a top surface of the first bottom electrode may be positioned at a level higher than that of the top surface of the landing pad, and a top surface of the second bottom electrode may be positioned at a level higher than that of the top surface of the landing pad.

In some embodiments, the method may further include forming a connection contact electrically connected to the landing pad and forming a connection pattern electrically connecting the connection contact to a top surface of the second magnetic tunnel junction pattern.

In some embodiments, the substrate may include first and second selection elements. The method may further include forming first and second contact plugs electrically connected to the first and second selection elements, respectively, before the forming of the interlayered insulating layer. The first bottom electrode may be electrically connected to the first contact plug, and the landing pad may be electrically connected to the second contact plug.

In some embodiments, the method may further include forming a first bit line electrically connected to a top surface of the first magnetic tunnel junction pattern and forming a second bit line, before the forming of the interlayered insulating layer. The second bit line may be electrically connected to the second bottom electrode.

In some embodiments, when viewed in a plan view, a distance between the first bottom electrode and the landing pad and a distance between the second bottom electrode and the landing pad may be smaller than a distance between the first and second bottom electrodes.

According to some embodiments, a magnetic memory device may include an interlayered insulating layer on a substrate, a landing pad passing through the interlayered insulating layer, first and second bottom electrodes passing through the interlayered insulating layer, a first magnetic tunnel junction pattern on the first bottom electrode, a bottom surface of the first magnetic tunnel junction pattern being electrically connected to the first bottom electrode, a second magnetic tunnel junction pattern on the second bottom electrode, a bottom surface of the second magnetic tunnel junction pattern being electrically connected to the second bottom electrode, a connection contact provided on and electrically connected to the landing pad, and a connection pattern electrically connecting the connection contact to a top surface of the second magnetic tunnel junction pattern. Top surfaces of the first and second bottom electrodes may be positioned at a higher level than that of a top surface of the landing pad.

In some embodiments, the substrate may include first and second selection elements. The magnetic memory device may further include a first contact plug electrically connecting the first selection element to the first bottom electrode, and a second contact plug electrically connecting the second selection element to the landing pad.

In some embodiments, the magnetic memory device may further include a first bit line electrically connected to a top surface of the first magnetic tunnel junction pattern and a second bit line electrically connected to the second bottom electrode.

In some embodiments, the top surface of the first bottom electrode may be positioned at the same level as that of the top surface of the second bottom electrode.

In some embodiments, when viewed in a plan view, a distance between the first bottom electrode and the landing pad and a distance between the second bottom electrode and the landing pad may be smaller than a distance between the first and second bottom electrodes.

In some embodiments, the magnetic memory device may further include a remaining protection insulating layer provided on the interlayered insulating layer to cover the top surface of the landing pad. The remaining protection insulating layer may have a top surface defining a recess region, and the recess region may be overlapped with the landing pad, when viewed in a plan view.

In some embodiments, the topmost surface of the remaining protection insulating layer may be coplanar with the top surfaces of the first and second bottom electrodes.

In some embodiments, each of the first and second bottom electrodes may have an upper portion upwardly protruding from a top surface of the interlayered insulating layer. The magnetic memory device may further include a first remaining protection insulating pattern covering a sidewall of the upper portion of the first bottom electrode and a second remaining protection insulating pattern covering a sidewall of the upper portion of the second bottom electrode.

In some embodiments, a top surface of the first remaining protection insulating pattern may be positioned at the same level as that of the top surface of the first bottom electrode, and a top surface of the second remaining protection insulating pattern may be positioned at the same level as that of the top surface of the second bottom electrode.

According to some embodiments, a magnetic memory device may include an interlayered insulating layer on a substrate, a landing pad through the interlayered insulating layer, a bottom electrode through the interlayered insulating layer, the bottom electrode extending above a top surface of the landing pad, a protection insulating film on the interlayered insulating layer, the protection insulating film extending along a portion of the bottom electrode extending above the top surface of the landing pad, and a magnetic tunnel junction pattern on the bottom electrode.

In some embodiments, the protection insulating film may be on a portion of the interlayered insulating layer separating the landing pad from the bottom electrode.

In some embodiments, the protection insulating film may cover a portion of the top surface of the landing pad.

In some embodiments, the protection insulating film may include a first portion contacting the bottom electrode, and a second portion covering the landing pad, the first portion being continuous with the second portion and being thicker than the second portion.

In some embodiments, the protection insulating film may fill a space between the magnetic tunnel junction pattern and the interlayered insulating layer along a sidewall of the bottom electrode, a portion of the protection insulating film extending beyond the magnetic tunnel junction pattern along a top surface of the interlayered insulating layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
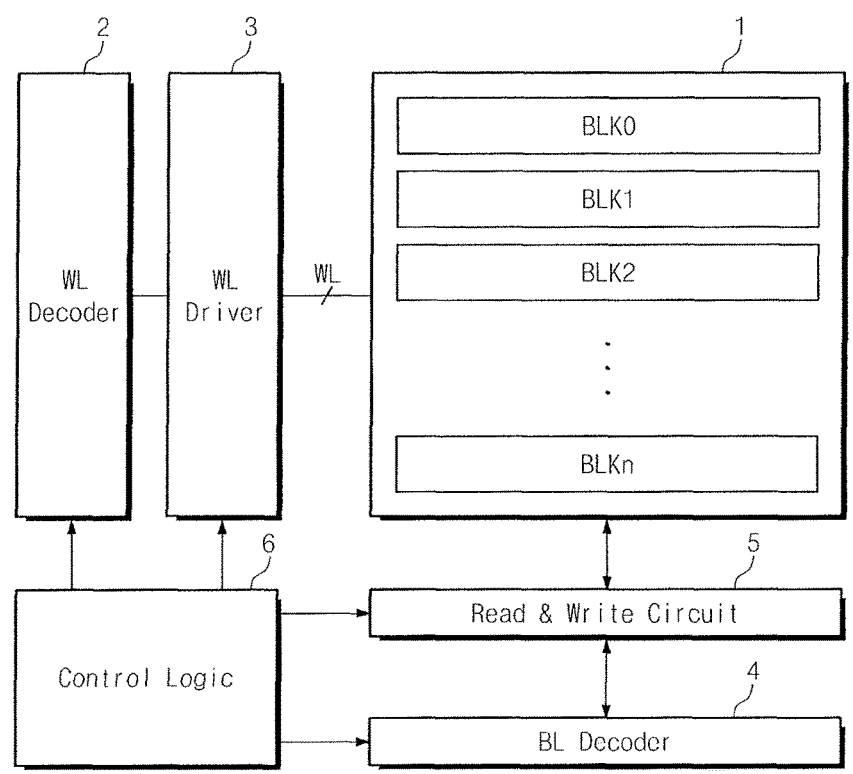
FIG. 1 illustrates a schematic block diagram of a memory device according to some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, the singular terms "a," "an" and "the" are intended to include the plural forms as well, unless the context clearly indicates otherwise. It will also be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements.

Additionally, the embodiments in the detailed description will be described with sectional views as ideal exemplary views. Accordingly, shapes of the exemplary views may be modified according to manufacturing techniques and/or allowable errors. Therefore, the embodiments are not limited to the specific shapes illustrated in the exemplary views, but may include other shapes that may be created according to manufacturing processes. That is, the figures are intended to illustrate the general characteristics of methods, structure and/or materials utilized in certain example embodiments and to supplement the written description provided below. These drawings, however, should not be interpreted as limiting the range of values or properties encompassed by some embodiments. For example, the dimensions of layers and regions may be reduced or exaggerated for clarity. The use of similar or identical reference numbers in the various drawings is intended to indicate the presence of a similar or identical element or feature.

Exemplary embodiments explained and illustrated herein include their complementary counterparts. The same reference numerals or the same reference designators denote the same elements throughout the specification.

FIG. 1 is a block diagram schematically illustrating a memory device according to some embodiments.

Referring to FIG. 1, a memory device may include a memory cell array 1, a word line decoder 2, a word line driver 3, a bit line decoder 4, a read and write circuit 5, and a control logic 6.

The memory cell array 1 may include a plurality of memory blocks BLK0-BLKn, and each of the memory blocks BLK0-BLKn may include a plurality of memory cells and word, bit, and source lines that are electrically connected to the memory cells.

The word line decoder 2 may be configured to decode the address information transmitted from the outside and select one of the bit lines based on the decoded address information. The address information decoded in the word line decoder 2 may be transmitted to the word line driver 3. Under the control of the control logic 6, the word line driver 3 may provide word line voltages, which are generated by a voltage generating circuit (not shown), to selected and unselected ones of the word lines. The word line decoder 2 and the word line driver 3 may be connected in common to the plurality of memory blocks BLK0-BLKn and may provide a driving signal to the word lines of the selected one of the memory blocks BLK0-BLKn, in response to a block selection signal.

The bit line decoder 4 may decode address information transmitted from the outside and then select one (or a pair) of the bit lines. The bit line decoder 4 may be connected in common to the plurality of memory blocks BLK0-BLKn and may provide data signals to the bit lines of the selected one of the memory blocks BLK0-BLKn, in response to the block selection signal.

The read and write circuit 5 may be connected to the memory cell array 1 through the bit lines. The read and write circuit 5 may be configured to select at least one of the bit lines, in response to a bit line selection signal from the bit line decoder 4. The read and write circuit 5 may be configured to exchange data with the external device. The read and write circuit 5 may be operated in response to control signals from the control logic 6. The read and write circuit 5 may be configured to receive a power (e.g., voltage or current) transmitted from the control logic 6 and to provide it to the selected at least one of the bit lines.

The control logic 6 may control overall operations of the memory device. The control logic 6 may receive control signals and an external voltage and may be operated in response to the received control signals. The control logic 6 may generate powers, which are required for internal operations of the memory device, using the external voltage. The control logic 6 controls read, write, and/or erase operations in response to the control signals.

Figure 2:
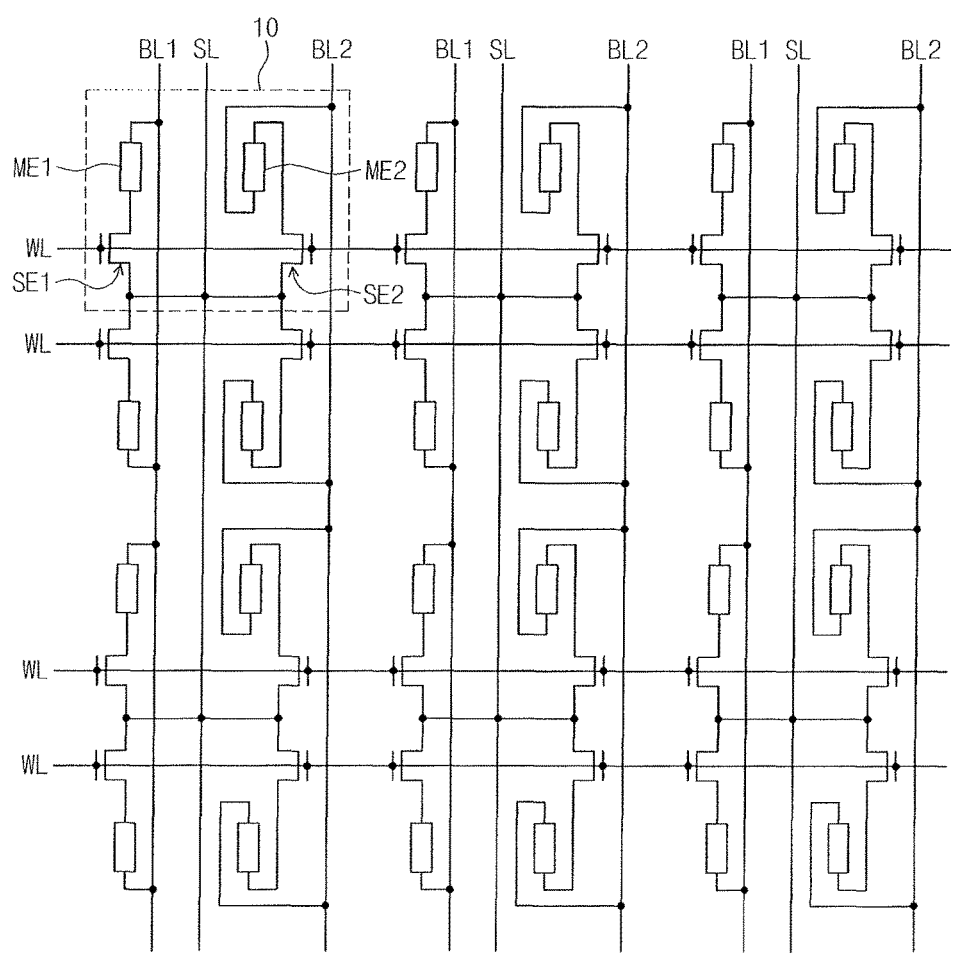
FIG. 2 illustrates a circuit diagram of a memory cell array of a memory device according to some embodiments.

FIG. 2 is a circuit diagram illustrating a memory cell array of a memory device according to some embodiments. For example, FIG. 2 is a circuit diagram illustrating an example of the memory cell array 1 described with reference to FIG. 1.

Referring to FIG. 2, the memory cell array 1 may include a plurality of word lines WL, a plurality of bit lines BL1 and BL2, a plurality of source lines SL, and a plurality of unit memory cells 10. The bit lines BL1 and BL2 may be arranged to cross the word lines WL. As shown in FIG. 2, the source lines SL may be parallel to the bit lines BL1 and BL2. However, embodiments are not limited thereto, and unlike that shown in FIG. 2, the source lines SL may be parallel to the word lines WL.

Each of the unit memory cells 10 may be provided between a corresponding one of the word line WL and a corresponding pair of the bit lines BL1 and BL2. Each of the unit memory cells 10 may include first and second memory elements ME1 and ME2 and first and second selection elements SE1 and SE2.

The first memory element ME1 may be disposed between the first selection element SE1 and the first bit line BL1, and the second memory element ME2 may be disposed between the second selection element SE2 and the second bit line BL2. The first selection element SE1 may be disposed between the first memory element ME1 and the source line SL, and the second selection element SE2 may be disposed between the second memory element ME2 and the source line SL. The first and second selection elements SE1 and SE2 may share a corresponding one of the source lines SL and may be controlled by a corresponding one of the word lines WL. In certain embodiments, a plurality of the unit memory cells 10 arranged parallel to the source line SL may be connected in common to the source line SL.

Each of the unit memory cells 10 may be selected by one of the word lines WL and a pair of the bit lines BL1 and BL2. In some embodiments, each of the first and second memory elements ME1 and ME2 may be a variable resistance element, whose electric resistance can be changed into one of two different values using an electric pulse applied thereto. The first and second memory elements ME1 and ME2 may be formed of a material, whose resistance is changeable depending on a magnitude and/or direction of an electric current or voltage applied thereto, and moreover, may have a non-volatile data storing property. In some embodiments, the first and second memory elements ME1 and ME2 may have a structure exhibiting a magneto-resistance property. For example, each of the first and second memory elements ME1 and ME2 may be provided to have substantially the same features as those of a magnetic tunnel junction pattern to be described with reference to FIG. 9A or FIG. 9B. In certain embodiments, the first and second memory elements ME1 and ME2 may contain at least one of perovskite compounds or transition metal oxides.

The first and second selection elements SE1 and SE2 may be, e.g., a diode, a PNP or NPN bipolar transistor, or a NMOS or PMOS field effect transistor. In some embodiments, the first and second selection elements SE1 and SE2 may control a flow of electric current to be supplied to the first and second memory elements ME1 and ME2, in response to voltages applied to the word lines WL.

Figure 3:
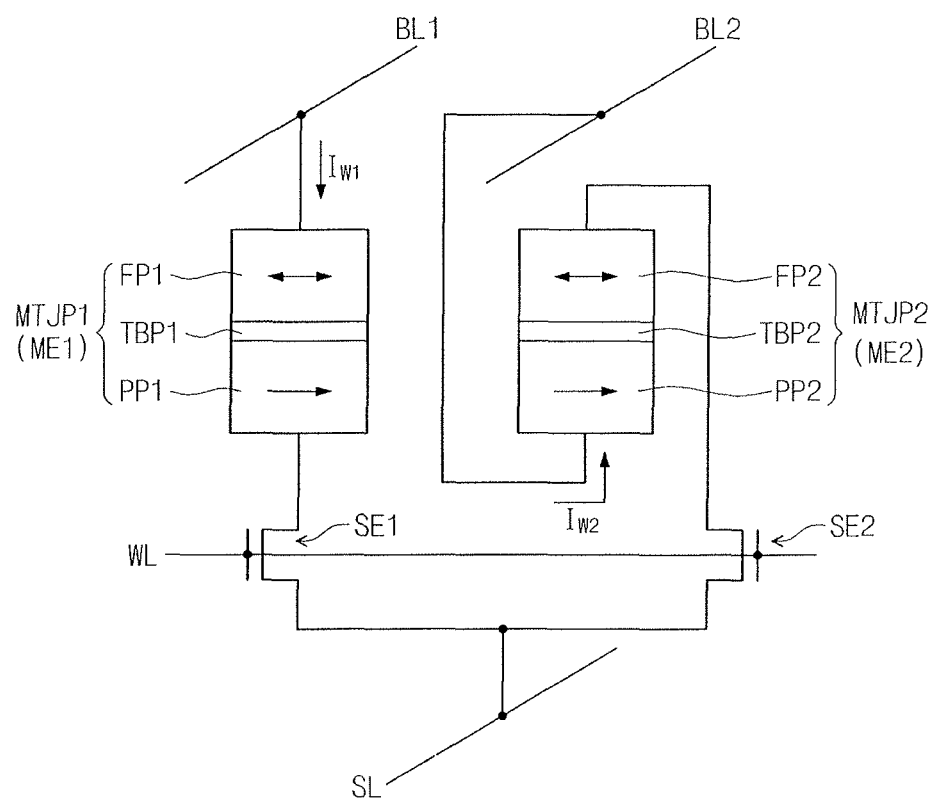
FIG. 3 illustrates a circuit diagram of a unit memory cell of a memory device according to some embodiments.

FIG. 3 is a circuit diagram illustrating the unit memory cell of a memory device according to some embodiments. For example, FIG. 3 may be a circuit diagram illustrating an example of the unit memory cell 10 of FIG. 2.

Referring to FIG. 3, the unit memory cell 10 may include first and second magnetic tunnel junction patterns MTJP1 and MTJP2 serving as the memory elements ME1 and ME2, and first and second selection transistors SE1 and SE2 serving as the selection elements SE1 and SE2. The first magnetic tunnel junction pattern MTJP1 may include a first free pattern FP1, a first pinned pattern PP1, and a first tunnel barrier pattern TBP1 interposed therebetween. The second magnetic tunnel junction pattern MTJP2 may include a second free pattern FP2, a second pinned pattern PP2, and a second tunnel barrier pattern TBP2 interposed therebetween. Each of the first and second pinned patterns PP1 and PP2 may have a fixed magnetization direction. The first free pattern FP1 may have a magnetization direction that can be changed to be parallel or antiparallel to that of the first pinned pattern PP1, and the second free pattern FP2 may have a magnetization direction that can be changed to be parallel or antiparallel to that of the second pinned pattern PP2. In some embodiments, each of the first and second magnetic tunnel junction patterns MTJP1 and MTJP2 may be provided to have substantially the same features as those of the magnetic tunnel junction pattern to be described with reference to FIG. 9A or FIG. 9B.

The first and second bit lines BL1 and BL2 may be provided to cross the word lines WL, and the source line SL may be connected in common to the first and second selection transistors SE1 and SE2. The first magnetic tunnel junction pattern MTJP1 may be disposed to electrically connect the first bit line BL1 to the first selection transistor SE1, and the first selection transistor SE1 may be disposed to electrically connect the first magnetic tunnel junction pattern MTJP1 to the source line SL. The second magnetic tunnel junction pattern MTJP2 may be disposed to electrically connect the second bit line BL2 to the second selection transistor SE2, and the second selection transistor SE2 may be disposed to electrically connect the second magnetic tunnel junction pattern MTJP2 to the source line SL.

In some embodiments, as shown in FIG. 3, the first free pattern FP1 may be connected to the first bit line BL1, and the first pinned pattern PP1 may be connected to the first selection transistor SE1. In such embodiments, the second free pattern FP2 may be connected to the second selection transistor SE2, and the second pinned pattern PP2 may be connected to the second bit line BL2.

In certain embodiments, unlike that shown in FIG. 3, the first pinned pattern PP1 may be connected to the first bit line BL1, and the first free pattern FP1 may be connected to the first selection transistor SE1. In such embodiments, the second pinned pattern PP2 may be connected to the second selection transistor SE2, and the second free pattern FP2 may be connected to the second bit line BL2. For the sake of simplicity, the description that follows will refer to embodiments in which the first free pattern FP1 is connected to the first bit line BL1, the first pinned pattern PP1 is connected to the first selection transistor SE1, the second free pattern FP2 is connected to the second selection transistor SE2, and the second pinned pattern PP2 is connected to the second bit line BL2.

In some embodiments, to write data '1' in a selected one of the unit memory cells 10, a turn-on voltage may be applied to the word line WL. A first bit line voltage may be applied to the first and second bit lines BL1 and BL2, and a first source line voltage lower than the first bit line voltage may be applied to the source line SL.

Under such voltage conditions, the first and second selection transistors SE1 and SE2 may be turned on to allow the first and second magnetic tunnel junction patterns MTJP1 and MTJP2 to be electrically connected to the source line SL. Also, a first write current IW1 may flow from the first bit line BL1 to the source line SL through the first magnetic tunnel junction pattern MTJP1, and a second write current IW2 may flow from the second bit line BL2 to the source line SL through the second magnetic tunnel junction pattern MTJP2. In this case, the first and second write currents IW1 and IW2 may pass through the first and second magnetic tunnel junction patterns MTJP1 and MTJP2, respectively, in opposite directions. That is, in such embodiments, if the first and second bit lines BL1 and BL2 are applied with the same voltage, write currents of opposite directions may be supplied to the first magnetic tunnel junction pattern MTJP1 and the second magnetic tunnel junction pattern MTJP2.

In detail, in the first magnetic tunnel junction pattern MTJP1, the first write current IW1 may flow in a direction from the first free pattern FP1 to the first pinned pattern PP1; that is, electrons of the first write current IW1 may be injected into the first magnetic tunnel junction pattern MTJP1 in the direction from the first pinned pattern PP1 toward the first free pattern FP1. In this case, some of such electrons that have the same spin direction as the first pinned pattern PP1 may pass through the first tunnel barrier pattern TBP1 (e.g., through a tunneling effect), and may exert a spin transfer torque to switch the magnetization of the first free pattern FP1. Accordingly, as a result of the injection of the first write current IW1, the magnetization direction of the first free pattern FP1 may be changed to be parallel to that of the first pinned pattern PP1. By contrast, in the second magnetic tunnel junction pattern MTJP2, the second write current IW2 may flow in a direction from the second pinned pattern PP2 to the second free pattern FP2; that is, electrons of the second write current IW2 may be injected into the second magnetic tunnel junction pattern MTJP2 in the direction from the second free pattern FP2 toward the second pinned pattern PP2. Some of such electrons that have a spin direction opposite to that of the second pinned pattern PP2 may be reflected from the second tunnel barrier pattern TBP2, and may exert a spin transfer torque to switch the magnetization of the second free pattern FP2. This makes it possible for the second free pattern FP2 to have a magnetization direction that is antiparallel to that of the second pinned pattern PP2.

As described above, the writing of the data '1' may be performed to allow the first magnetic tunnel junction pattern MTJP1 to have parallel magnetization directions and allow the second magnetic tunnel junction pattern MTJP2 to have antiparallel magnetization directions. In other words, as a result of the writing of the data '1', the first magnetic tunnel junction pattern MTJP1 may be in a low resistance state and the second magnetic tunnel junction pattern MTJP2 may be in a high resistance state.

In some embodiments, to write data '0' in a selected one of the unit memory cells 10, a turn-on voltage may be applied to the word line WL. A second bit line voltage may be applied to the first and second bit lines BL1 and BL2, and a second source line voltage higher than the second bit line voltage may be applied to the source line SL.

Under such voltage conditions, currents flowing in directions opposite to those of the first and second write currents IW1 and IW2 may be applied to the first and second magnetic tunnel junction patterns MTJP1 and MTJP2, respectively. Accordingly, contrary to the writing of the data '1', magnetization directions of the first magnetic tunnel junction pattern MTJP1 may be changed to be antiparallel to each other, and magnetization directions of the second magnetic tunnel junction pattern MTJP2 may be changed to be parallel to each other. In other words, as a result of the writing of the data '0', the first magnetic tunnel junction pattern MTJP1 may be in a high resistance state and the second magnetic tunnel junction pattern MTJP2 may be in a low resistance state.

Since, as described above, the first and second magnetic tunnel junction patterns MTJP1 and MTJP2 have resistance states that are different from each other, one of the first and second magnetic tunnel junction patterns MTJP1 and MTJP2 may be used to define a reference resistance value, when a read operation is performed on the unit memory cell 10. In other words, it is possible to realize a finite difference in resistance value between the first and second magnetic tunnel junction patterns MTJP1 and MTJP2, which can be used as a sensing margin in an operation of reading data from the unit memory cell 10, and this makes it possible to improve operational or data reliability of the unit memory cell 10.

Figure 4:
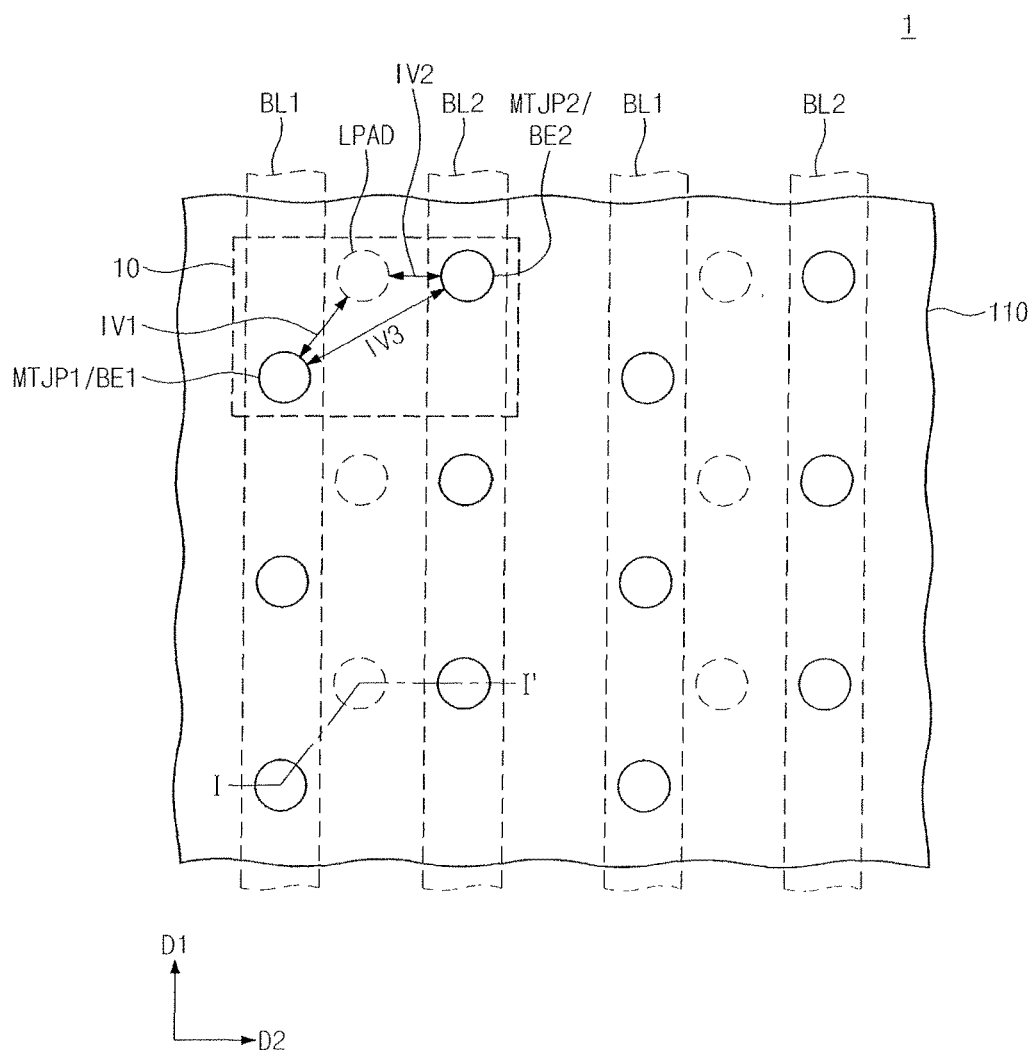
FIG. 4 illustrates a plan view of a memory cell array of a memory device according to some embodiments.
Figure 5:
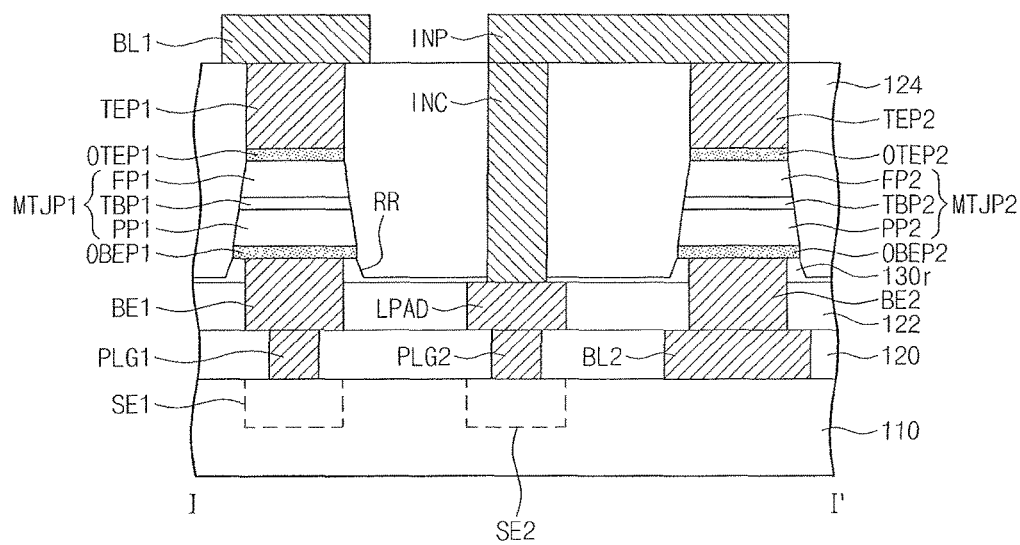
FIG. 5 illustrates a sectional view along line I-I' of FIG. 4 to illustrate a unit memory cell of a memory device according to some embodiments.

FIG. 4 is a plan view illustrating a memory cell array of a memory device according to some embodiments. For example, FIG. 4 illustrates an example of the memory cell array 1 described with reference to FIGS. 1 and 2. FIG. 5 is a sectional view that is taken along line I-I' of FIG. 4 to illustrate a unit memory cell of a memory device according to some embodiments. For example, FIG. 5 illustrates an example of the unit memory cell 10 described with reference to FIGS. 2 and 3.

Referring to FIG. 4, the memory cell array 1 may include the unit memory cells 10. The unit memory cells 10 may be two-dimensionally arranged in a first direction D1 and a second direction D2 crossing each other. Each of the unit memory cells 10 may include the first and second selection elements (not shown) and the first and second magnetic tunnel junction patterns MTJP1 and MTJP2 that are provided on a substrate 110. In some embodiments, when viewed in a plan view, the first and second magnetic tunnel junction patterns MTJP1 and MTJP2 may be disposed to form a zigzag arrangement in the first direction D1, but embodiments are not limited thereto.

Each of the unit memory cells 10 may be connected to a pair of bit lines (e.g., the first and second bit lines BL1 and BL2). The first bit line BL1 may extend in the first direction D1 and may be electrically connected to the first magnetic tunnel junction patterns MTJP1 of the unit memory cells 10 arranged along the first direction D1. The second bit line BL2 may extend in the first direction D1 and may be electrically connected to the second magnetic tunnel junction patterns MTJP2 of the unit memory cells 10 arranged along the first direction D1.

Hereinafter, each of the unit memory cells 10 will be described in detail with reference to FIGS. 4 and 5.

Referring to FIGS. 4 and 5, the substrate 110 may be provided. The substrate 110 may include the first and second selection transistors SE1 and SE2. The first and second selection transistors SE1 and SE2 may be controlled by one of the word lines (not shown). Furthermore, the source line (not shown) may be connected in common to source regions of the first and second selection transistors SE1 and SE2.

A first interlayered insulating layer 120 may be provided on the substrate 110. The first interlayered insulating layer 120 may be formed of or include, e.g., silicon oxide, silicon nitride, and/or silicon oxynitride.

First and second contact plugs PLG1 and PLG2 and the second bit line BL2 may be provided on the substrate 110. The first contact plug PLG1 may be connected to a drain region (for example, in or on the substrate 110) of the first selection transistor SE1 by passing through the first interlayered insulating layer 120. The second contact plug PLG2 may be connected to a drain region (for example, in or on the substrate 110) of the second selection transistor SE2 by passing through the first interlayered insulating layer 120. The second bit line BL2 may be disposed in the first interlayered insulating layer 120 and may extend in the first direction D1. In some embodiments, the first and second contact plugs PLG1 and PLG2 and the second bit line BL2 may be positioned at substantially the same level. In the present specification, the term 'level' may refer to a vertical distance from the top surface of the substrate 110. Each of the first and second contact plugs PLG1 and PLG2 and the second bit line BL2 may include a conductive material.

A second interlayered insulating layer 122 may be provided on the first interlayered insulating layer 120. The second interlayered insulating layer 122 may include, e.g., silicon oxide, silicon nitride, and/or silicon oxynitride.

First and second bottom electrodes BE1 and BE2 and a landing pad LPAD may be provided to pass through the second interlayered insulating layer 122. The first bottom electrode BE1 may be electrically connected to the first contact plug PLG1 by passing through the second interlayered insulating layer 122, and the second bottom electrode BE2 may be electrically connected to the second bit line BL2 by passing through the second interlayered insulating layer 122. The landing pad LPAD may be electrically connected to the second contact plug PLG2 by passing through the second interlayered insulating layer 122. Each of the first and second bottom electrodes BE1 and BE2 and the landing pad LPAD may include a conductive material. For example, each of the first and second bottom electrodes BE1 and BE2 and the landing pad LPAD may include at least one of metallic materials (e.g., copper, aluminum, tungsten, or titanium).

As illustrated in FIG. 5, the first and second bottom electrodes BE1 and BE2 may have top surfaces positioned at a higher level than that of the landing pad LPAD, e.g., a distance between a top surface of each of the first and second bottom electrodes BE1 and BE2 and a top surface of the substrate 110 may be larger than a distance between a top surface of the landing pad LPAD and the top surface of the substrate 110. For example, the top surface of the landing pad LPAD may be positioned at substantially the same level as the top surface of the second interlayered insulating layer 122. In other words, the top surfaces of the landing pad LPAD and the second interlayered insulating layer 122 may be substantially coplanar with each other.

Each of the first and second bottom electrodes BE1 and BE2 may have an upper portion upwardly protruding relative to the top surface of the second interlayered insulating layer 122, e.g., each of the first and second bottom electrodes BE1 and BE2 may have an upper portion extending above the top surface of the second interlayered insulating layer 122. Accordingly, the top surface of each of the first and second bottom electrodes BE1 and BE2 may be positioned at a higher level than that of the second interlayered insulating layer 122. In some embodiments, the top surfaces of the first and second bottom electrodes BE1 and BE2 may be positioned at substantially the same level.

As illustrated in FIG. 4, when viewed in a plan view, a space IV1 between the first bottom electrode BE1 and the landing pad LPAD may be smaller than a space IV3 between the first and second bottom electrodes BE1 and BE2. Further, a space IV2 between the second bottom electrode BE2 and the landing pad LPAD may be smaller than the space IV3 between the first and second bottom electrodes BE1 and BE2. In some embodiments, as shown in FIG. 4, the landing pad LPAD may be adjacent to the second bottom electrode BE2 along the second direction, so the space IV2 may be smaller than the space IV1. However, in other embodiments, other arrangements of the landing pad LPAD, in which the space IV2 may be smaller than the space IV1, are possible.

In some embodiments, as shown in FIG. 5, a remaining protection insulating layer 130r may be provided on the second interlayered insulating layer 122. For example, the remaining protection insulating layer 130r may include a protruding portion adjacent to and along upper sidewalls of the first and second bottom electrodes BE1 and BE2, and a recess region RR that is recessed relative to the protruding portion, e.g., the remaining protection insulating layer 130r may have a top surface (a top surface of the protruding portion) defining the recess region RR.

In detail, the remaining protection insulating layer 130r may cover the top surface of the landing pad LPAD, e.g., may entirely overlap the landing pad LPAD, and thus, the top surface of the landing pad LPAD may not be exposed. When viewed in a plan view, the recess region RR of the remaining protection insulating layer 130r may overlap the landing pad LPAD, and may be spaced apart from the first and second bottom electrodes BE1 and BE2 with the protruding portion of the remaining protection insulating layer 130r therebetween, e.g., the recess region RR of the remaining protection insulating layer 130r may not overlap the first and second bottom electrodes BE1 and BE2 along the first and second direction. The topmost surface of, e.g., the protruding portion of, the remaining protection insulating layer 130r may be positioned at substantially the same level as the top surfaces of the first and second bottom electrodes BE1 and BE2. In other words, the topmost surface of the remaining protection insulating layer 130r may be coplanar with the top surfaces of the first and second bottom electrodes BE1 and BE2. The recess region RR of the remaining protection insulating layer 130r may have a bottom surface that is positioned at a lower level than the top surfaces of the first and second bottom electrodes BE1 and BE2. The remaining protection insulating layer 130r may include an insulating material. As an example, the remaining protection insulating layer 130r may be formed of or include silicon oxide, silicon nitride, and/or silicon oxynitride.

Figure 6:
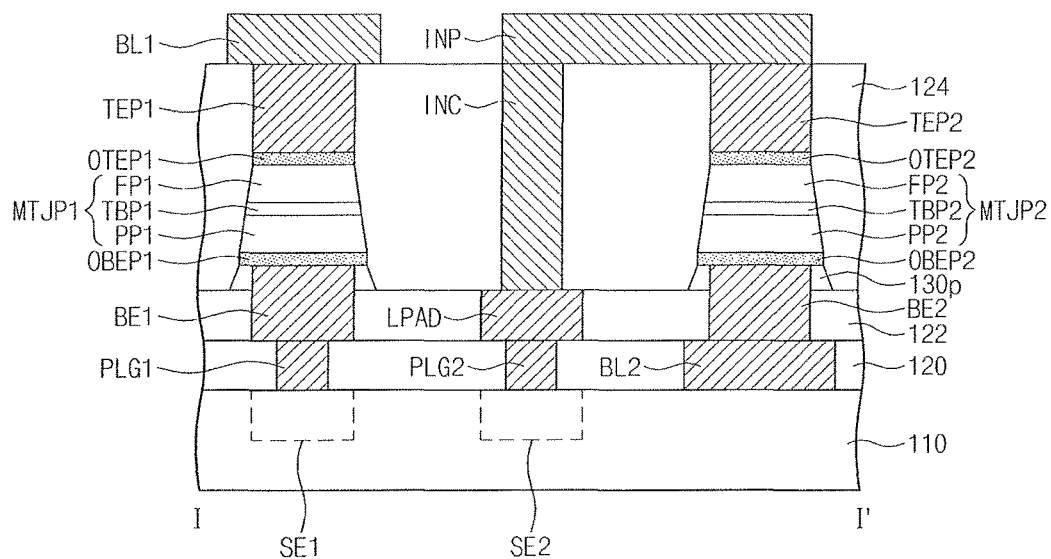
FIG. 6 illustrates a sectional view along line I-I' of FIG. 4 to illustrate a unit memory cell of a memory device according to some embodiments.

In certain embodiments, as shown in FIG. 6, remaining protection insulating patterns 130p may be provided on the second interlayered insulating layer 122 instead of the remaining protection insulating layer 130r. These embodiments will be described with reference to FIG. 6.

Referring back to FIG. 5, a first optional bottom electrode pattern OBEP1, the first magnetic tunnel junction pattern MTJP1, a first optional top electrode pattern OTEP1, and a first top electrode pattern TEP1 may be sequentially stacked on the first bottom electrode BE1. A second optional bottom electrode pattern OBEP2, the second magnetic tunnel junction pattern MTJP2, a second optional top electrode pattern OTEP2, and a second top electrode pattern TEP2 may be sequentially stacked on the second bottom electrode BE2.

The first and second optional bottom electrode patterns OBEP1 and OBEP2 and the first and second optional top electrode patterns OTEP1 and OTEP2 may include at least one of conductive metal nitrides, e.g., titanium nitride and/or tantalum nitride. The first and second top electrode patterns TEP1 and TEP2 may be formed of or include at least one of metals (e.g., tungsten, tantalum, aluminum, copper, gold, silver, titanium) or conductive metal nitrides thereof.

The first magnetic tunnel junction pattern MTJP1 may include the first free pattern FP1, the first pinned pattern PP1, and the first tunnel barrier pattern TBP1 interposed therebetween. The second magnetic tunnel junction pattern MTJP2 may include the second free pattern FP2, the second pinned pattern PP2, and the second tunnel barrier pattern TBP2 interposed therebetween. The stacking order of the first free pattern FP1, the first pinned pattern PP1, and the first tunnel barrier pattern TBP1 may be the same as that of the second free pattern FP2, the second pinned pattern PP2, and the second tunnel barrier pattern TBP2.

In some embodiments, as shown in FIG. 5, the pinned patterns PP1 and PP2, the tunnel barrier patterns TBP1 and TBP2, and the free patterns FP1 and FP2 may be stacked, in the order enumerated, on the substrate 110. However, embodiments are not limited thereto, e.g., the free patterns FP1 and FP2, the tunnel barrier patterns TBP1 and TBP2, and the pinned patterns PP1 and PP2 may be stacked, in the order enumerated, on the substrate 110, unlike that shown in FIG. 5. For the sake of simplicity, the description that follows will refer to an example in which the stacking order is the same as that shown in FIG. 5.

Similar to the previous embodiments described with reference to FIG. 3, the first pinned pattern PP1 may be connected to the drain region (for example, in or on the substrate 110) of the first selection transistor SE1 through the first bottom electrode BE1 and the first contact plug PLG1. Also, the second pinned pattern PP2 may be connected to the second bit line BL2 through the second bottom electrode BE2. The first and second magnetic tunnel junction patterns MTJP1 and MTJP2 will be described in more detail with reference to FIG. 9A and/or FIG. 9B.

A third interlayered insulating layer 124 may be provided on the second interlayered insulating layer 122 to cover the first and second magnetic tunnel junction patterns MTJP1 and MTJP2. The third interlayered insulating layer 124 may be formed of or include, e.g., silicon oxide, silicon nitride, and/or silicon oxynitride.

A connection contact INC may be provided to penetrate the third interlayered insulating layer 124 and to be electrically connected to the landing pad LPAD. The connection contact INC may include a conductive material. As an example, the connection contact INC may include at least one of metallic materials (e.g., copper, aluminum, tungsten, or titanium).

The first bit line BL1 and a connection pattern INP may be provided on the third interlayered insulating layer 124. The first bit line BL1 may be electrically connected to the first top electrode pattern TEP1. The connection pattern INP may electrically connect the connection contact INC with the second top electrode pattern TEP2. Accordingly, similar to that described with reference to FIG. 3, the first free pattern FP1 may be connected to the first bit line BL1 through the first top electrode pattern TEP1. Also, the second free pattern FP2 may be connected to the drain region (for example, in or on the substrate 110) of the second selection transistor SE2 through the second top electrode pattern TEP2, the connection pattern INP, the connection contact INC, the landing pad LPAD, and the second contact plug PLG2. Each of the first bit line BL1 and the connection pattern INP may include a conductive material. For example, each of the first bit line BL1 and the connection pattern INP may include at least one of metallic materials (e.g., copper, aluminum, tungsten, or titanium).

FIG. 6 is a sectional view that is taken along line I-I' of FIG. 4 to illustrate a unit memory cell of a memory device according to some embodiments. For instance, FIG. 6 illustrates an example of the unit memory cell described with reference to FIGS. 2 and 3.

Referring to FIGS. 4 and 6, the unit memory cell 10 may be provided to have a similar structure to that described with reference to FIGS. 4 and 5. For example, except that the remaining protection insulating layer 130r is replaced with the remaining protection insulating patterns 130p, the unit memory cell 10 may be configured to have substantially the same features as the unit memory cell described with reference to FIGS. 4 and 5. Thus, only the remaining protection insulating patterns 130p will be described below, without repeating an overlapping description of the other elements.

The remaining protection insulating patterns 130p may be provided on the second interlayered insulating layer 122. Each of the remaining protection insulating patterns 130p may be provided to cover an upper sidewall of each of the first and second bottom electrodes BE1 and BE2, e.g., to cover a sidewall of a portion of the first and second bottom electrodes BE1 and BE2 protruding above the top surface of the second interlayered insulating layer 122. The top surface of the landing pad LPAD may be exposed between the remaining protection insulating patterns 130p. The topmost surfaces of the remaining protection insulating patterns 130p may be positioned at substantially the same level as the top surfaces of the first and second bottom electrodes BE1 and BE2. In other words, the topmost surfaces of the remaining protection insulating patterns 130p may be coplanar with the top surfaces of the first and second bottom electrodes BE1 and BE2. The remaining protection insulating patterns 130p may be formed of or include an insulating material. For example, the remaining protection insulating patterns 130p may be formed of or include silicon oxide, silicon nitride, and/or silicon oxynitride.

FIGS. 7A through 7H are sectional views illustrating stages in a method of fabricating the unit memory cell described with reference to FIGS. 4 and 5. For concise description, an element previously described with reference to FIGS. 4 and 5 may be identified by a similar or identical reference number and a duplicating description thereof may be omitted.

Figure 7A:
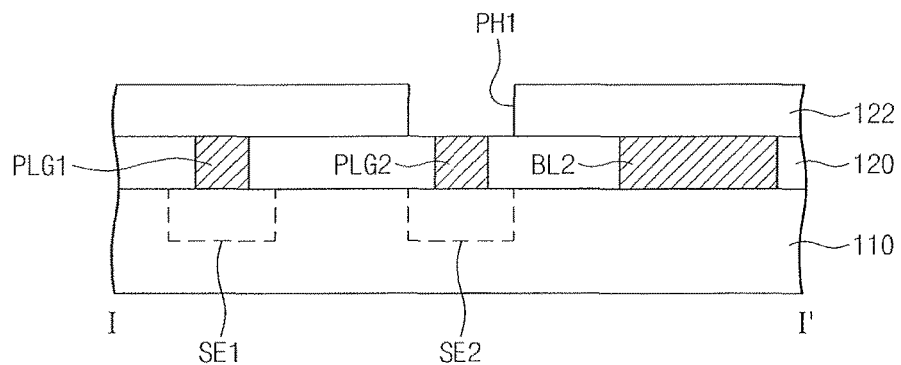
FIGS. 7A through 7H illustrate sectional views of stages in a method of fabricating the unit memory cell described with reference to FIGS. 4 and 5.

Referring to FIGS. 4 and 7A, the substrate 110 including the first and second selection transistors SE1 and SE2 may be provided.

The first interlayered insulating layer 120 may be formed on the substrate 110. The first interlayered insulating layer 120 may be formed of or include, e.g., silicon oxide, silicon nitride, and/or silicon oxynitride. The first interlayered insulating layer 120 may be formed by, e.g., a chemical vapor deposition (CVD) process or a physical vapor deposition (PVD) process.

The first and second contact plugs PLG1 and PLG2 may be formed to pass through the first interlayered insulating layer 120. The first contact plug PLG1 may be connected to the first selection transistor SE1, and the second contact plug PLG2 may be connected to the second selection transistor SE2. In addition, the second bit line BL2 may be formed in the first interlayered insulating layer 120.

The second interlayered insulating layer 122 may be formed on the first interlayered insulating layer 120. The second interlayered insulating layer 122 may be formed of or include, e.g., silicon oxide, silicon nitride, and/or silicon oxynitride. The second interlayered insulating layer 122 may be formed by, e.g., a chemical vapor deposition (CVD) process or a physical vapor deposition (PVD) process.

A first penetration hole PH1 may be formed to penetrate the second interlayered insulating layer 122. In some embodiments, the first penetration hole PH1 may be formed to expose the second contact plug PLG2. The formation of the first penetration hole PH1 may include forming a photoresist pattern (not shown) on the second interlayered insulating layer 122 and etching the second interlayered insulating layer 122 using the photoresist pattern as an etch mask.

Figure 7B:
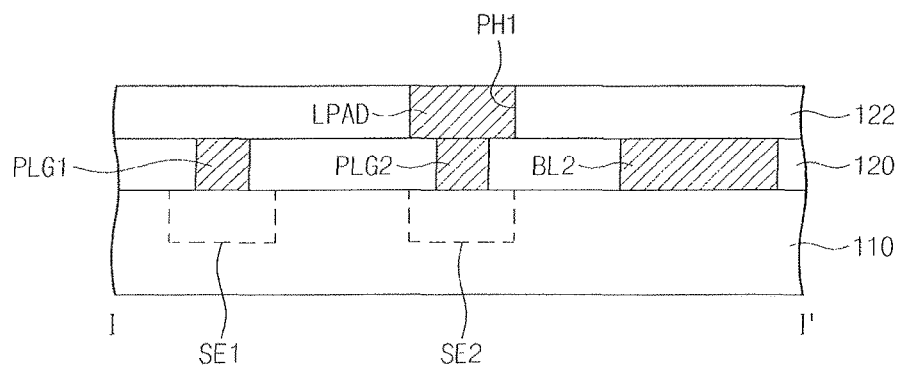

Referring to FIGS. 4 and 7B, the landing pad LPAD may be formed to fill the first penetration hole PH1. The formation of the landing pad LPAD may include forming a conductive layer (not shown) to fill the first penetration hole PH1 and planarizing the conductive layer to expose the top surface of the second interlayered insulating layer 122. Accordingly, the top surface of the landing pad LPAD may be positioned at substantially the same level as the top surface of the second interlayered insulating layer 122. The landing pad LPAD may be connected to the second contact plug PLG2.

Figure 7C:
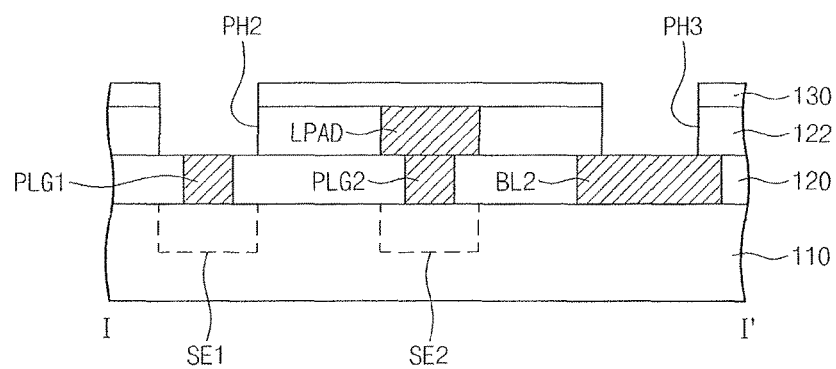

Referring to FIGS. 4 and 7C, a protection insulating layer 130 may be formed on the second interlayered insulating layer 122. The protection insulating layer 130 may be formed to cover the top surface of the landing pad LPAD, and thus, the top surface of the landing pad LPAD may not be exposed. The protection insulating layer 130 may be formed of or include an insulating material. For example, the protection insulating layer 130 may be formed of or include silicon oxide, silicon nitride, and/or silicon oxynitride. The protection insulating layer 130 may be formed by, e.g., a chemical vapor deposition (CVD) process or a physical vapor deposition (PVD) process.

Second and third penetration holes PH2 and PH3 may be formed to penetrate the protection insulating layer 130 and the second interlayered insulating layer 122. The formation of the second and third penetration holes PH2 and PH3 may include forming a photoresist pattern (not shown) on the protection insulating layer 130 and sequentially etching the protection insulating layer 130 and the second interlayered insulating layer 122 using the photoresist pattern as an etch mask. The second penetration hole PH2 may be formed to expose the first contact plug PLG1, and the third penetration hole PH3 may be formed to expose the second bit line BL2.

Figure 7D:
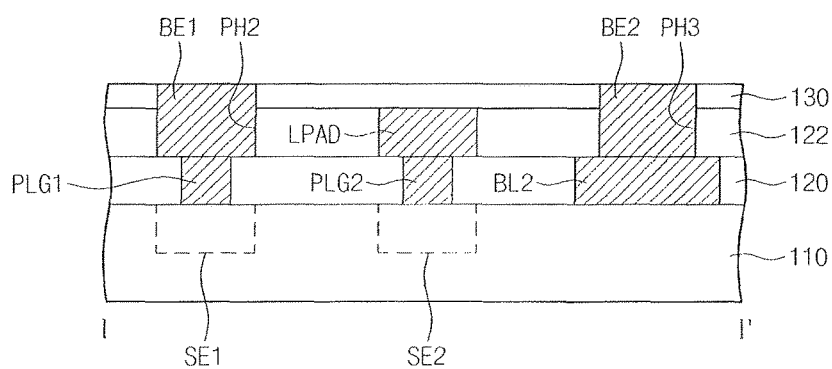

Referring to FIGS. 4 and 7D, the first bottom electrode BE1 may be formed to fill the second penetration hole PH2, and the second bottom electrode BE2 may be formed to fill the third penetration hole PH3. The formation of the first and second bottom electrodes BE1 and BE2 may include forming a conductive layer (not shown) to fill the second and third penetration holes PH2 and PH3 and planarizing the conductive layer to expose the top surface of the protection insulating layer 130. Accordingly, the top surfaces of the first and second bottom electrodes BE1 and BE2 may be positioned at a level that is substantially equal to that of the top surface of the protection insulating layer 130 and is higher than that of the top surface of the landing pad LPAD. The first bottom electrode BE1 may be connected to the first contact plug PLG1, and the second bottom electrode BE2 may be connected to the second bit line BL2.

Figure 7E:
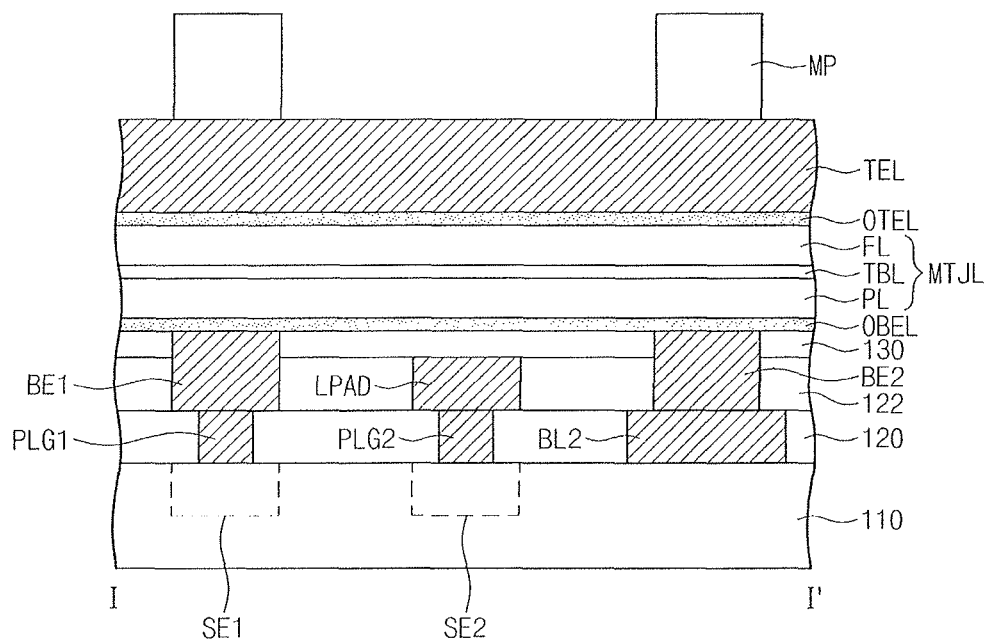

Referring to FIGS. 4 and 7E, an optional bottom electrode layer OBEL, a magnetic tunnel junction layer MTJL, an optional top electrode layer OTEL, and a top electrode layer TEL may be sequentially formed on the protection insulating layer 130. Each of the layers OBEL, MTJL, OTEL, and TEL may be formed by, e.g., a CVD or PVD process.

The optional bottom electrode layer OBEL and the optional top electrode layer OTEL may include at least one of conductive metal nitrides, e.g., titanium nitride and/or tantalum nitride. In some embodiments, at least one of the optional bottom electrode layer OBEL and the optional top electrode layer OTEL may be omitted. Hereinafter, for the sake of simplicity, the description that follows will refer to an example in which the optional bottom electrode layer OBEL and the optional top electrode layer OTEL are provided, but embodiments are not limited thereto.

The magnetic tunnel junction layer MTJL may include a pinned layer PL, a tunnel barrier layer TBL, and a free layer FL, which are sequentially stacked on a substrate, but embodiments are not limited thereto. For example, in some embodiments, the stacking order of the pinned layer PL and the free layer FL may be changed from the above. The magnetic tunnel junction layer MTJL will be described in more detail with reference to FIG. 9A and/or FIG. 9B.

Mask patterns MP may be formed on the top electrode layer TEL. When viewed in a plan view, the mask patterns MP may be overlapped with the first and second bottom electrodes BE1 and BE2. The mask patterns MP may be formed of or include, e.g., silicon oxide, silicon nitride, and/or silicon oxynitride.

Figure 7F:
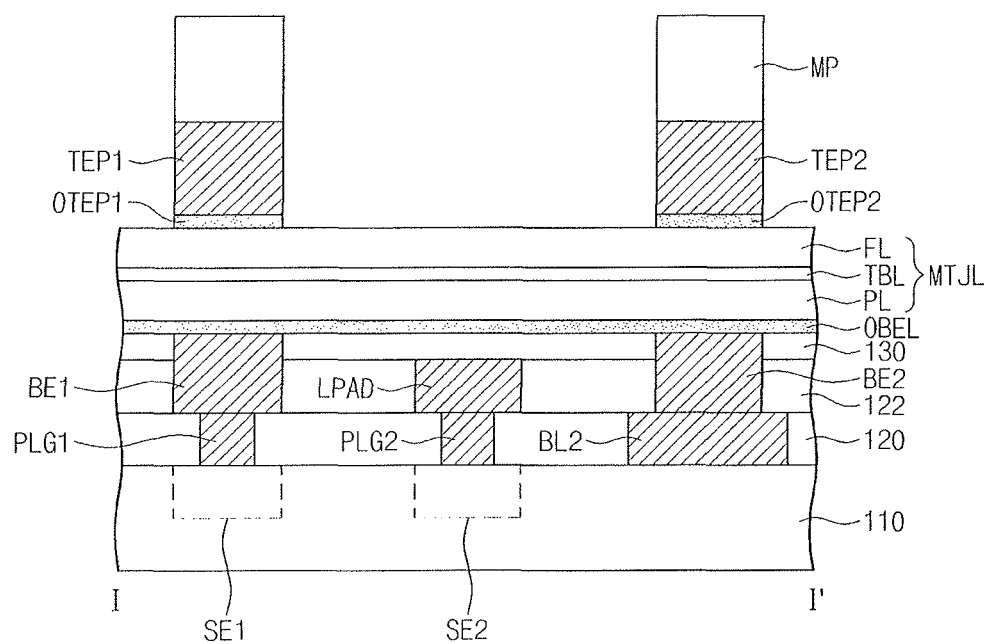

Referring to FIGS. 4 and 7F, the first and second top electrode patterns TEP1 and TEP2 and the first and second optional top electrode patterns OTEP1 and OTEP2 may be formed. The first and second top electrode patterns TEP1 and TEP2 and the first and second optional top electrode patterns OTEP1 and OTEP2 may be formed by sequentially pattering the top electrode layer TEL and the optional top electrode layer OTEL using the mask patterns MP as an etch mask. For example, the patterning process may be performed by a dry etching method (e.g., a reactive ion etching (RIE) method).

Figure 7G:
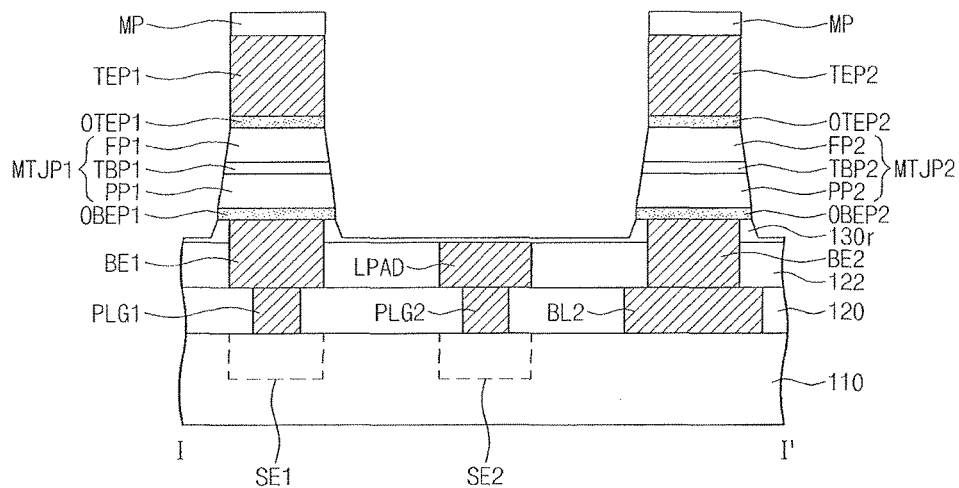

Referring to FIGS. 4 and 7G, the first optional bottom electrode patterns OBEP1 and the first magnetic tunnel junction patterns MTJP1 may be formed on the first bottom electrode BE1, and the second optional bottom electrode patterns OBEP2 and the second magnetic tunnel junction patterns MTJP2 may be formed on the second bottom electrode BE2. The formation of the first and second magnetic tunnel junction patterns MTJP1 and MTJP2 and the first and second optional bottom electrode patterns OBEP1 and OBEP2 may include pattering the magnetic tunnel junction layer MTJL and the optional bottom electrode layer OBEL using the mask patterns MP as an etch mask. The patterning process may be performed using, e.g., an ion beam etching (IBE) process.

In some embodiments, as a result of the process of pattering the magnetic tunnel junction layer MTJL and the optional bottom electrode layer OBEL, the protection insulating layer 130 may be partially etched to form the remaining the protection insulating layer 130r. The remaining protection insulating layer 130r may cover the top surface of the landing pad LPAD, and thus, the top surface of the landing pad LPAD may not be exposed.

In general, during a process of forming magnetic tunnel junction pattern, a landing pad may be exposed and etched if the protection insulating layer 130 is not used. In this case, etch residue may be produced from the landing pad and may be re-deposited on a sidewall of the magnetic tunnel junction pattern, and thus, a short circuit may be formed between free and pinned layers of the magnetic tunnel junction pattern. While increasing a horizontal distance between the landing pad and the magnetic tunnel junction pattern may minimize such etch residue, it may be difficult to increase an integration density of a magnetic memory device in this way.

In contrast, according to example embodiments, the method of fabricating a magnetic memory device includes forming the protection insulating layer 130 on the landing pad LPAD. Accordingly, the protection insulating layer 130 covers the landing pad LPAD, and prevents the landing pad LPAD from being etched when the first and second magnetic tunnel junction patterns MTJP1 and MTJP2 are formed. In other words, the protection insulating layer 130 may be thick at least enough to protect the landing pad LPAD during etching of the first and second magnetic tunnel junction patterns MTJP1 and MTJP2. This may prevent etch residue of the landing pad LPAD from being re-deposited on a sidewall of the magnetic tunnel junction pattern, and may make it possible to prevent a short circuit from being formed between the first free pattern FP1 and the pinned pattern PP1, and between the second free pattern FP2 and the second pinned pattern PP2. Thus, it is possible to realize a highly reliable magnetic memory device.

Furthermore, according to some embodiments, as it is possible to prevent etching by-products, which may be produced from the landing pad LPAD, from being re-deposited on sidewalls of magnetic tunnel junction patterns, the landing pad LPAD may be formed adjacent to the first magnetic tunnel junction pattern MTJP1 or the second magnetic tunnel junction pattern MTJP2. For example, the landing pad LPAD may be formed adjacent to the first bottom electrode BE1 or the second bottom electrode BE2. In other words, as the protection insulating layer 130 covers the landing pad LPAD and prevents etching by-products of the landing pad LPAD from being re-deposited on sidewalls of magnetic tunnel junction patterns, a horizontal distance between the landing pad LPAD and the first and second bottom electrodes BE1 and BE2 may be minimized. For example, as shown in FIG. 4, when viewed in a plan view, the space IV1 between the first bottom electrode BE1 and the landing pad LPAD and the space IV2 between the second bottom electrode BE2 and the landing pad LPAD may be smaller than the space IV3 between the first and second bottom electrodes BE1 and BE2. This may make it possible to increase an integration density of a magnetic memory device.

Figure 7H:
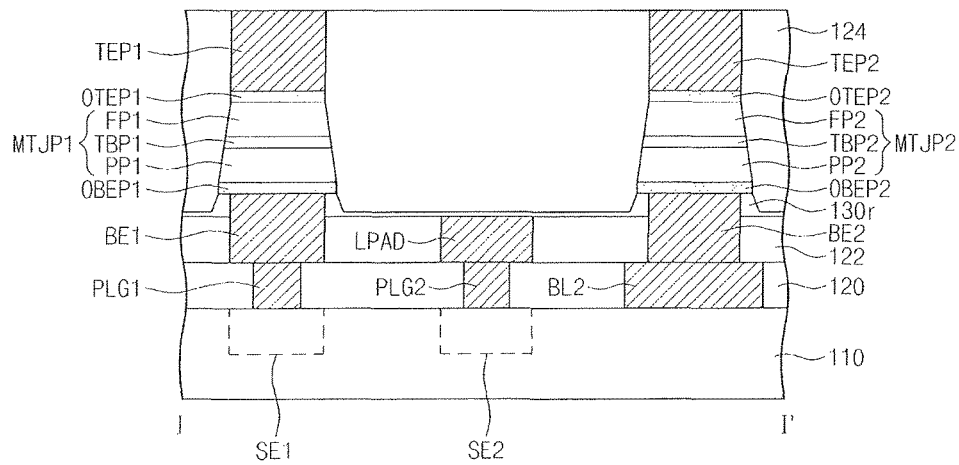

Referring to FIGS. 4 and 7H, the third interlayered insulating layer 124 may be formed on the second interlayered insulating layer 122 to cover the first and second magnetic tunnel junction patterns MTJP1 and MTJP2. The third interlayered insulating layer 124 may be formed of or include, e.g., silicon oxide, silicon nitride, and/or silicon oxynitride. The third interlayered insulating layer 124 may be formed by, e.g., a chemical vapor deposition (CVD) process or a physical vapor deposition PVD process. In addition, a planarization process may be performed on the third interlayered insulating layer 124 and the mask patterns MP to expose top surfaces of the first and second top electrode patterns TEP1 and TEP2.

Referring back to FIGS. 4 and 5, the connection contact INC may be formed to pass through the third interlayered insulating layer 124 and be connected to the landing pad LPAD. Furthermore, the first bit line BL1 and the connection pattern INP may be formed on the third interlayered insulating layer 124. The first bit line BL1 may be electrically connected to the first top electrode pattern TEP1, and the connection pattern INP may connect the connection contact INC electrically with the second top electrode pattern TEP2. In some embodiments, the connection contact INC, the connection pattern INP, and the first bit line BL1 may be formed at the same time by using a damascene process.

Figure 8A:
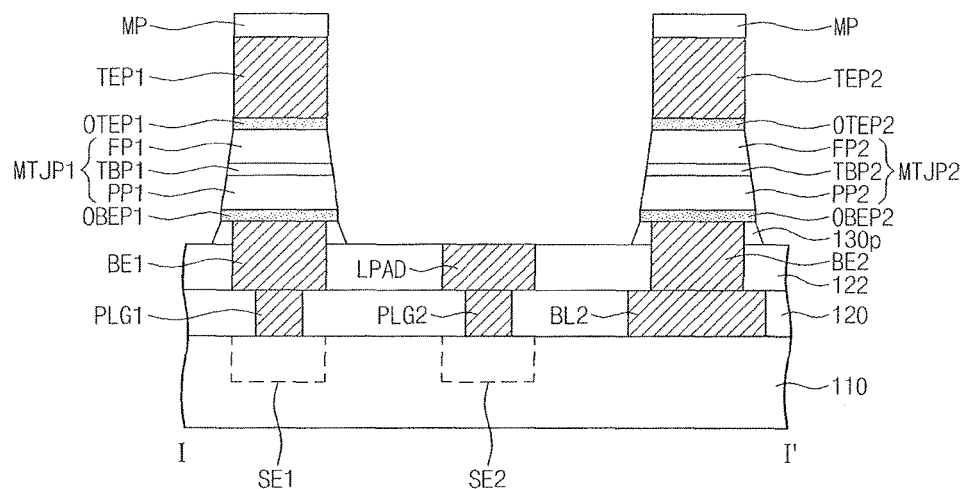
FIGS. 8A and 8B illustrate sectional views of stages in a method of fabricating the unit memory cell described with reference to FIGS. 4 and 6.
Figure 8B:
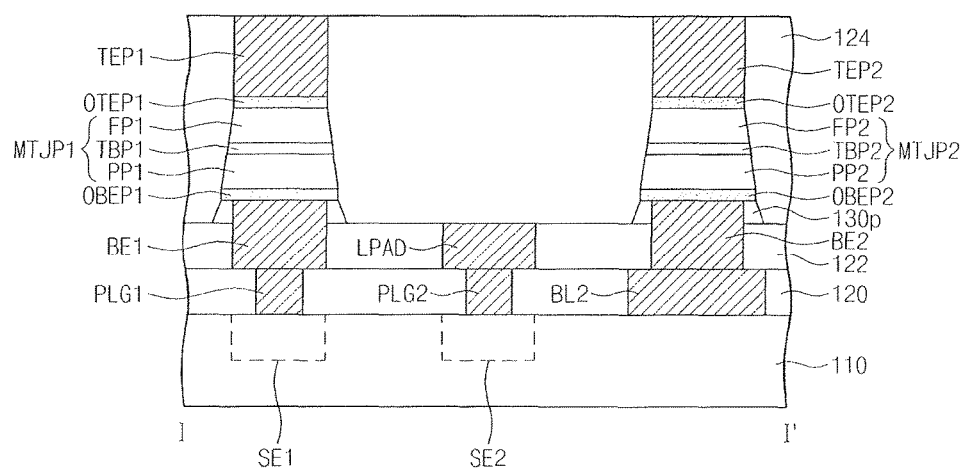

FIGS. 8A and 8B are sectional views illustrating stages in a method of fabricating the unit memory cell described with reference to FIGS. 4 and 6. For concise description, elements previously described with reference to FIGS. 4 and 6 may be identified by a similar or identical reference number and a duplicate description thereof may be omitted.

The method to be described below may include substantially the same or similar stages that are previously described with reference to FIGS. 4 and 7A to 7F. For concise description, a duplicate description of the stages described with reference to FIGS. 4 and 7A to 7F is omitted. Stages of the method after that described with reference to FIG. 7F is described below.

Referring to FIGS. 4 and 8A, the first optional bottom electrode patterns OBEP1 and the first magnetic tunnel junction patterns MTJP1 may be formed on the first bottom electrode BE1, and the second optional bottom electrode patterns OBEP2 and the second magnetic tunnel junction patterns MTJP2 may be formed on the second bottom electrode BE2. The formation of the first and second magnetic tunnel junction patterns MTJP1 and MTJP2 and the first and second optional bottom electrode patterns OBEP1 and OBEP2 may include pattering the magnetic tunnel junction layer MTJL and the optional bottom electrode layer OBEL using the mask patterns MP as an etch mask. The patterning process may be performed using, for example, an ion beam etching (IBE) process.

As a result of the process of pattering the magnetic tunnel junction layer MTJL and the optional bottom electrode layer OBEL, the protection insulating layer 130 may be partially etched to form the remaining protection insulating patterns 130p. The top surface of the landing pad LPAD may be exposed between the remaining protection insulating patterns 130p.

In these embodiments, the protection insulating layer 130 may prevent the landing pad LPAD from being etched in the process of forming the magnetic tunnel junction patterns MTJP1 and MTJP2. This may make it possible to prevent or suppress a short circuit from being formed between the first free pattern FP1 and the pinned pattern PP1, and between the second free pattern FP2 and the second pinned pattern PP2. Accordingly, it is possible to realize a highly reliable magnetic memory device.

Referring to FIGS. 4 and 8B, the third interlayered insulating layer 124 may be formed on the second interlayered insulating layer 122 to cover the first and second magnetic tunnel junction patterns MTJP1 and MTJP2. In addition, a planarization process may be performed on the third interlayered insulating layer 124 and the mask patterns to expose top surfaces of the first and second top electrode patterns TEP1 and TEP2.

Referring back to FIGS. 4 and 6, the connection contact INC may be formed to pass through the third interlayered insulating layer 124 and may be connected to the landing pad LPAD. Furthermore, the first bit line BL1 and the connection pattern INP may be formed on the third interlayered insulating layer 124. The first bit line BL1 may be electrically connected to the first top electrode pattern TEP1, and the connection pattern INP may connect the connection contact INC with the second top electrode pattern TEP2. In some embodiments, the connection contact INC, the connection pattern INP, and the first bit line BL1 may be formed at the same time by using a damascene process.

Figure 9A:
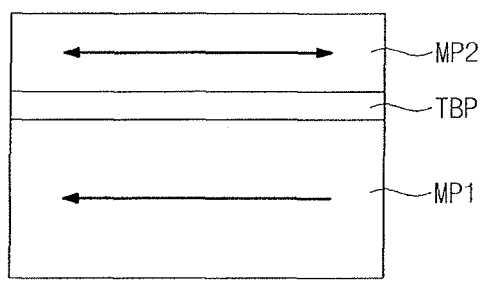
FIGS. 9A and 9B illustrate schematic diagrams of magnetic tunnel junction patterns according to some embodiments.
Figure 9B:
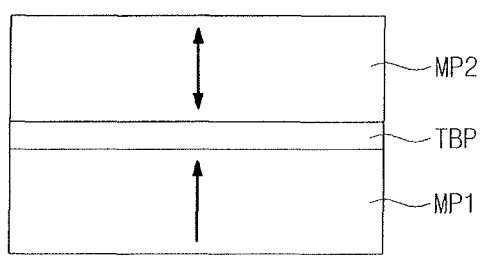

FIGS. 9A and 9B are schematic diagrams provided to describe magnetic tunnel junction patterns according to some embodiments. The magnetic tunnel junction pattern MTJP may include the first magnetic pattern MP1, the tunnel barrier pattern TBP, and the second magnetic pattern MP2. One of the first magnetic pattern MP1 and the second magnetic pattern MP2 may serve as a free pattern of a magnetic tunnel junction (MTJ), and the other may serve as a pinned pattern of the MTJ. For the sake of simplicity, the description that follows will refer to one of embodiments in which the first and second magnetic patterns MP1 and MP2 are used as pinned and free patterns, respectively, but in certain embodiments, the first and second magnetic patterns MP1 and MP2 may be used as the free and fixed patterns, respectively. Electrical resistance of the magnetic tunnel junction pattern MTJP may be sensitive to a relative orientation of magnetization directions of the free and pinned patterns. For example, the electric resistance of the magnetic tunnel junction pattern MTJP may be much higher when magnetization directions of the free and fixed patterns are anti-parallel than when they are parallel. This means that the electric resistance of the magnetic tunnel junction pattern MTJP can be controlled by changing the magnetization direction of the free pattern, and the magnetic memory devices according to some embodiments may be realized based on this data-storing mechanism.

Referring to FIG. 9A, the first magnetic pattern MP1 and the second magnetic pattern MP2 may be configured to have an in-plane magnetization structure; for example, each of them may be or include at least one magnetic layer, whose magnetization direction is substantially parallel to a top surface of the tunnel barrier pattern TBP. In such embodiments, the first magnetic pattern MP1 may include two layers, one of which includes an antiferromagnetic material, and the other of which includes a ferromagnetic material. The layer including the antiferromagnetic material may include at least one of, e.g., PtMn, IrMn, MnO, MnS, MnTe, $MnF_2$, $FeCl_2$, FeO, $CoCl_2$, CoO, $NiCl_2$, NiO, or Cr. In some embodiments, the layer including the antiferromagnetic material may include at least one of precious metals. The precious metals may include, e.g., ruthenium (Ru), rhodium (Rh), palladium (Pd), osmium (Os), iridium (Ir), platinum (Pt), gold (Au), or silver (Ag). The layer including the ferromagnetic material may include at least one of, e.g., CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may be configured to have a variable or switchable magnetization direction. For example, the second magnetic pattern MP2 may include a ferromagnetic material. As an example, the second magnetic pattern MP2 may be formed of or include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may include a plurality of layers. For example, the second magnetic pattern MP2 may include a plurality of ferromagnetic layers and at least one non-magnetic layer interposed between the ferromagnetic layers. In this case, the ferromagnetic layers and the non-magnetic layer may constitute a synthetic antiferromagnetic layer. The presence of the synthetic antiferromagnetic layer may make it possible to reduce a critical current density of the magnetic memory device and improve a thermal stability of the magnetic memory device.

The tunnel barrier pattern TBP may include at least one of, e.g., magnesium oxide, titanium oxide, aluminum oxide, magnesium-zinc oxide, magnesium-boron oxide, titanium nitride, or vanadium nitride. As an example, the tunnel barrier pattern TBP may be a single layer of magnesium oxide (MgO). Alternatively, the tunnel barrier pattern TBP may include a plurality of layers. The tunnel barrier pattern TBP may be formed by a CVD process.

Referring to FIG. 9B, the first and second magnetic patterns MP1 and MP2 may be configured to have a perpendicular magnetization structure; for example, each of them may be or include at least one magnetic layer, whose magnetization direction is substantially normal to the top surface of the tunnel barrier pattern TBP. In such embodiments, the first and second magnetic patterns MP1 and MP2 may include at least one of, e.g., materials with an L10 crystal structure, materials having the hexagonal closed packed structure, or amorphous rare-earth transition metal (RE-TM) alloys. As an example, the first and second magnetic patterns MP1 and MP2 may include at least one of L10 materials, e.g., $Fe_{50}Pt_{50}$, $Fe_{50}Pd_{50}$, $Co_{50}Pt_{50}$, $Co_{50}Pd_{50}$, and $Fe_{50}Ni_{50}$. In other embodiments, the first and second magnetic patterns MP1 and MP2 may include at least one of cobalt-platinum (CoPt) disordered HCP alloys having a platinum content of about 10% to about 45, or $Co_3Pt$ ordered HCP alloys hexagonal close packed. In still other embodiments, the first and second magnetic patterns MP1 and MP2 may include at least one of the amorphous RE-TM alloys containing at least one of, e.g., iron (Fe), cobalt (Co), or nickel (Ni), and at least one of rare-earth metals, e.g., terbium (Tb), dysprosium (Dy), and gadolinium (Gd).

The first and second magnetic patterns MP1 and MP2 may include a material with an interface perpendicular magnetic anisotropy. The interface perpendicular magnetic anisotropy may refer to a perpendicular magnetization phenomenon, which may be seen at an interface of a magnetic layer with an intrinsically in-plane magnetization property, when the magnetic layer is in contact with another layer. Here, the term "intrinsic in-plane magnetization property" will be used to mean that a magnetization direction of a magnetic layer is oriented parallel to a longitudinal direction thereof, when there is no external magnetic field applied thereto. For example, in the case that a magnetic layer with the intrinsic in-plane magnetization property is formed on a substrate and there is no external magnetic field applied thereto, a magnetization direction of the magnetic layer may be oriented substantially parallel to the top surface of the substrate.

As an example, the first magnetic pattern MP1 and the second magnetic pattern MP2 may include at least one of cobalt (Co), iron (Fe), or nickel (Ni). The first magnetic pattern MP1 and the second magnetic pattern MP2 may further include at least one of non-magnetic materials including, e.g., boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). As an example, the first magnetic pattern MP1 and the second magnetic pattern MP2 may include a layer of CoFe or NiFe, in which boron (B) is added. Furthermore, at least one of the first magnetic pattern MP1 and the second magnetic pattern MP2 may further include at least one of, e.g., titanium (Ti), aluminum (Al), magnesium (Mg), tantalum (Ta), or silicon (Si), to lower saturation magnetization thereof. The first magnetic pattern MP1 and the second magnetic pattern MP2 may be formed by, for example, a sputtering process or a CVD process.

The magnetic tunnel junction layer MTJL of FIG. 7E may be configured to contain the same material as the magnetic tunnel junction pattern MTJP.

By way of summation and review, in the method of fabricating a magnetic memory device according to some embodiments, the landing pad is formed to have a top surface positioned at a lower level than that of a bottom electrode, i.e., a buried landing pad, so an area of a metallic layer exposed during an MTJ etching process may be reduced. In detail, a protection insulating layer may be formed on the landing pad. Accordingly, when a magnetic tunnel junction pattern is formed, it is possible to prevent the landing pad from being etched and re-deposited on a sidewall of the formed magnetic tunnel junction pattern. This may make it possible to prevent a short circuit from being formed between the free and pinned patterns of the magnetic tunnel junction pattern. As a result, it is possible to improve reliability of a magnetic memory device.

Furthermore, according to some embodiments, as the landing pad is prevented from being etched (and etching by-products are prevented from being produced and re-deposited on the sidewall of the magnetic tunnel junction pattern), the landing pad may be formed adjacent to the magnetic tunnel junction pattern. For example, the landing pad may be formed adjacent to a bottom electrode of the magnetic tunnel junction pattern. That is, a distance between the landing pad and the bottom electrode may be minimized. This may make it possible to increase an integration density of a magnetic memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
   an interlayered insulating layer on a substrate;
   a landing pad through the interlayered insulating layer;
   first and second bottom electrodes through the interlayered insulating layer;
   a first magnetic tunnel junction pattern on the first bottom electrode, a bottom surface of the first magnetic tunnel junction pattern being electrically connected to the first bottom electrode;
   a second magnetic tunnel junction pattern on the second bottom electrode, a bottom surface of the second magnetic tunnel junction pattern being electrically connected to the second bottom electrode;
   a connection contact on and electrically connected to the landing pad; and
   a connection pattern electrically connecting the connection contact to a top surface of the second magnetic tunnel junction pattern,
   wherein top surfaces of the first and second bottom electrodes are at a higher level than that of a top surface of the landing pad.

2. The magnetic memory device as claimed in claim 1, wherein:
   the substrate includes first and second selection elements, and
   the magnetic memory device further comprises:
   a first contact plug electrically connecting the first selection element to the first bottom electrode, and
   a second contact plug electrically connecting the second selection element to the landing pad.

3. The magnetic memory device as claimed in claim 2, further comprising:
   a first bit line electrically connected to a top surface of the first magnetic tunnel junction pattern; and
   a second bit line electrically connected to the second bottom electrode.

4. The magnetic memory device as claimed in claim 1, wherein the top surface of the first bottom electrode is at the same level as that of the top surface of the second bottom electrode.

5. The magnetic memory device as claimed in claim 1, wherein, when viewed in a plan view, each of a distance between the first bottom electrode and the landing pad and a distance between the second bottom electrode and the landing pad is smaller than a distance between the first and second bottom electrodes.

6. The magnetic memory device as claimed in claim 1, further comprising a remaining protection insulating layer on the interlayered insulating layer, the remaining protection insulating layer covering the top surface of the landing pad,
   wherein the remaining protection insulating layer has a top surface defining a recess region, the recess region overlapping the landing pad, when viewed in a plan view.

7. The magnetic memory device as claimed in claim 6, wherein the topmost surface of the remaining protection insulating layer is coplanar with the top surfaces of the first and second bottom electrodes.

8. The magnetic memory device as claimed in claim 1, wherein:
   each of the first and second bottom electrodes has an upper portion upwardly protruding from a top surface of the interlayered insulating layer, and
   the magnetic memory device further comprises:
   a first remaining protection insulating pattern covering a sidewall of the upper portion of the first bottom electrode, and
   a second remaining protection insulating pattern covering a sidewall of the upper portion of the second bottom electrode.

9. The magnetic memory device as claimed in claim 8, wherein a top surface of the first remaining protection insulating pattern is at a same level as that of the top surface of the first bottom electrode, and a top surface of the second remaining protection insulating pattern is at a same level as that of the top surface of the second bottom electrode.

10. A magnetic memory device, comprising:
    an interlayered insulating layer on a substrate;
    a landing pad through the interlayered insulating layer;
    a bottom electrode through the interlayered insulating layer, the bottom electrode extending above a top surface of the landing pad;
    a protection insulating film on the interlayered insulating layer, the protection insulating film extending along a portion of the bottom electrode extending above the top surface of the landing pad; and
    a magnetic tunnel junction pattern on the bottom electrode and covering a topmost surface of the protection insulating film, a surface of the protection insulating film exposed by the magnetic tunnel junction pattern having a lower height than the topmost surface relative to the substrate.

11. The magnetic memory device as claimed in claim 10, wherein the protection insulating film is on a portion of the interlayered insulating layer separating the landing pad from the bottom electrode.

12. The magnetic memory device as claimed in claim 10, wherein the protection insulating film covers a portion of the top surface of the landing pad.

13. The magnetic memory device as claimed in claim 12, wherein the protection insulating film includes a first portion contacting the bottom electrode, and a second portion covering the landing pad, the first portion being continuous with the second portion and being thicker than the second portion.

14. The magnetic memory device as claimed in claim 10, wherein the protection insulating film fills a space between the magnetic tunnel junction pattern and the interlayered insulating layer along a sidewall of the bottom electrode, a portion of the protection insulating film extending beyond the magnetic tunnel junction pattern along a top surface of the interlayered insulating layer.

15. The magnetic memory device as claimed in claim 10, wherein the topmost surface of the protection insulating film defines a recess region that overlaps the landing pad in a top view.

16. The magnetic memory device as claimed in claim 10, wherein the surface of the protection insulating film exposed by the magnetic tunnel junction pattern includes an inclined surface extending from a bottom of the magnetic tunnel junction pattern toward the interlayered insulating layer.

17. The magnetic memory device as claimed in claim 16, wherein the inclined surface of the protection insulating film and the magnetic tunnel junction pattern have a non-overlapping relationship in top view.

18. The magnetic memory device as claimed in claim 10, further comprising:
    a connection contact connected to the landing pad; and
    a connection pattern connecting the connection contact to the magnetic tunnel junction pattern.

* * * * *